(12) United States Patent
Nagatomo et al.

(10) Patent No.: US 9,237,682 B2
(45) Date of Patent: Jan. 12, 2016

(54) POWER MODULE SUBSTRATE WITH HEAT SINK, AND METHOD FOR PRODUCING POWER MODULE SUBSTRATE WITH HEAT SINK

(71) Applicant: MITSUBISHI MATERIALS CORPORATION, Tokyo (JP)

(72) Inventors: Yoshiyuki Nagatomo, Saitama (JP); Hiroya Ishizuka, Koshigaya (JP); Toshiyuki Nagase, Gotenba (JP); Yoshirou Kuromitsu, Saitama (JP); Masakazu Edo, Susono (JP); Hideyuki Miyake, Susono (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/388,560

(22) PCT Filed: Mar. 29, 2013

(86) PCT No.: PCT/JP2013/059464
§ 371 (c)(1),
(2) Date: Sep. 26, 2014

(87) PCT Pub. No.: WO2013/147121
PCT Pub. Date: Oct. 3, 2013

(65) Prior Publication Data
US 2015/0055303 A1    Feb. 26, 2015

(30) Foreign Application Priority Data

Mar. 30, 2012 (JP) ................... 2012-083247

(51) Int. Cl.
*H01L 23/34* (2006.01)
*C23C 8/00* (2006.01)
(Continued)

(52) U.S. Cl.
CPC .............. *H05K 7/209* (2013.01); *C04B 37/026* (2013.01); *H01L 23/3735* (2013.01);
(Continued)

(58) Field of Classification Search
None
See application file for complete search history.

(56) References Cited

U.S. PATENT DOCUMENTS 6,033,787 A    3/2000  Nagase et al.
2006/0046035 A1  3/2006  Tanaka et al.
(Continued)

FOREIGN PATENT DOCUMENTS

CN    1277650 C    10/2006
JP    10-065075 A   3/1998
(Continued)

OTHER PUBLICATIONS

International Search Report mailed Jun. 25, 2013, issued for PCT/JP2013/059464 and English translation thereof.
(Continued)

*Primary Examiner* — Adam Krupicka
(74) *Attorney, Agent, or Firm* — Locke Lord LLP (57) ABSTRACT

This power module substrate with a heat sink includes a power module substrate having a circuit layer disposed on one surface of an insulating layer, and a heat sink bonded to the other surface of this power module substrate, wherein the bonding surface of the heat sink and the bonding surface of the power module substrate are each composed of aluminum or an aluminum alloy, a bonding layer (50) having a Mg-containing compound (52) (excluding MgO) which contains Mg dispersed in an Al—Si eutectic composition is formed at the bonding interface between the heat sink and the power module substrate, and the thickness t of this bonding layer (50) is within a range from 5 μm to 80 μm.

4 Claims, 6 Drawing Sheets

(51) Int. Cl.
  *H05K 7/20* (2006.01)
  *H01L 23/373* (2006.01)
  *H01L 23/473* (2006.01)
  *C04B 37/02* (2006.01)
  *H01L 23/40* (2006.01)

(52) U.S. Cl.
  CPC ...... *H01L 23/473* (2013.01); *C04B 2235/6584* (2013.01); *C04B 2237/121* (2013.01); *C04B 2237/128* (2013.01); *C04B 2237/343* (2013.01); *C04B 2237/366* (2013.01); *C04B 2237/368* (2013.01); *C04B 2237/402* (2013.01); *C04B 2237/704* (2013.01); *C04B 2237/706* (2013.01); *C04B 2237/86* (2013.01); *H01L 23/4006* (2013.01); *H01L 2224/32225* (2013.01)

(56) References Cited

U.S. PATENT DOCUMENTS

| 2009/0174063 A1 | 7/2009 | Furukawa et al. |
| 2010/0264520 A1 | 10/2010 | Ogawa |

FOREIGN PATENT DOCUMENTS

| JP | 2002-064169 A | 2/2002 |
| JP | 2009-105166 A | 5/2009 |
| JP | 2009-135392 A | 6/2009 |
| JP | 2010-093225 A | 4/2010 |
| JP | 2010-247209 A | 11/2010 |
| JP | 2010-258420 A | 11/2010 |
| JP | 2011-238892 A | 11/2011 |
| JP | 2012-061483 A | 3/2012 |
| JP | 2012-160722 A | 8/2012 |
| JP | 2013-093369 A | 5/2013 |
| WO | WO-2007/017945 A1 | 2/2007 |

OTHER PUBLICATIONS

Decision for Grant of Patent mailed Jun. 9, 2015, issued for the Korean patent application No. 10-2014-7026261 and English translation thereof.

Office Action mailed Apr. 1, 2015, issued for the Chinese patent application No. 201380016243.8 and English translation thereof.

Notice of Allowance mailed Apr. 8, 2015 issued for the Taiwanese patent application No. 102111535 and English translation thereof.

POWER MODULE SUBSTRATE WITH HEAT SINK, AND METHOD FOR PRODUCING POWER MODULE SUBSTRATE WITH HEAT SINK

TECHNICAL FIELD

The present invention relates to a power module substrate with a heat sink in which the bonding surface of the heat sink and the bonding surface of the power module substrate are each formed from aluminum or an aluminum alloy, and also relates to a method for producing the power module substrate with a heat sink Priority is claimed on Japanese Patent Application No. 2012-083247, filed Mar. 30, 2012, the content of which is incorporated herein by reference.

BACKGROUND ART

Examples of the power module substrate with a heat sink mentioned above include those proposed in Patent Documents 1 to 3.

In the power module substrates with heat sinks disclosed in Patent Documents 1 and 2, a power module substrate prepared by bonding metal sheets (a circuit layer and a metal layer) of Al (aluminum) to both surfaces of a ceramic substrate composed of MN (aluminum nitride), and a heat sink formed from aluminum are bonded together by brazing using an Al—Si-based brazing material.

Further, in a cooling device for a semiconductor module described in Patent Document 3, a structure is proposed in which a semiconductor module, which is prepared by bonding metal sheets (an upper electrode and a lower electrode) of Al (aluminum) to both surfaces of an insulating substrate composed of a ceramic material and also includes a semiconductor element bonded to the upper electrode, and a top plate of a cooling unit formed from aluminum are bonded together by brazing using a flux.

This brazing using a flux is a technique mainly used for bonding aluminum members together, and is a technique in which, for example, an Al—Si-based brazing material foil and a flux are positioned between the aluminum members, and the flux removes the oxide films formed on the surfaces of the aluminum members and promotes the melting of the brazing material, thereby achieving bonding.

DOCUMENTS OF RELATED ART

Patent Documents

Patent Document 1: Japanese Unexamined Patent Application, First Publication No. 2010-093225
Patent Document 2: Japanese Unexamined Patent Application, First Publication No. 2009-135392
Patent Document 3: Japanese Unexamined Patent Application, First Publication No. 2009-105166

DISCLOSURE OF INVENTION

Problems to be Solved by the Invention

In the case of aluminum members, because aluminum oxide films are formed on the surfaces of these members, favorable bonding cannot be achieved by simply performing brazing.

Accordingly, in Patent Documents 1 and 2, the effects of these aluminum oxide films is suppressed by performing the brazing in a vacuum atmosphere using a vacuum furnace, thereby enabling favorable mutual bonding of aluminum members.

However, if the degree of vacuum during brazing is low, then the effects of the oxide films cannot be adequately suppressed, and there is a possibility of a deterioration in the bonding reliability. However, increasing the degree of vacuum requires significant time and effort, and therefore the brazing cannot be performed efficiently and the cost tends to increase considerably.

On the other hand, in Patent Document 3, because the aluminum oxide films are removed by the flux during bonding of the aluminum members, the brazing need not be performed in a vacuum atmosphere, and can be performed under normal pressure conditions in a non-oxidizing atmosphere of nitrogen gas or the like.

However, because a flux is used, a problem arises in that the brazing operation becomes more complex. Further, when a flux is used during bonding of a power module substrate and a heat sink as described above, there is a possibility that a portion of the flux components may evaporate and penetrate into the bonding interfaces and the like between the ceramic substrate of the power module substrate and the metal sheets, resulting in a deterioration in the bonding reliability between the ceramic substrate and the metal sheets.

The present invention has been developed in light of the above circumstances, and has an object of providing a power module substrate with a heat sink prepared by strong brazing under normal pressure conditions without using a flux, as well as providing a method for producing the power module substrate with a heat sink.

Means to Solve the Problems

In order to address the problems outlined above and achieve the above object, a power module substrate with a heat sink of the present invention includes a power module substrate having a circuit layer disposed on one surface of an insulating layer, and a heat sink bonded to an other surface of the power module substrate, wherein a bonding surface of the heat sink and a bonding surface of the power module substrate are each composed of aluminum or an aluminum alloy, a bonding layer having a Mg-containing compound (excluding MgO) which contains Mg dispersed in an Al—Si eutectic composition is formed at a bonding interface between the heat sink and the power module substrate, and a thickness of this bonding layer is within a range from not less than 5 μm to not more than 80 μm.

According to the power module substrate with a heat sink of this configuration, because the bonding layer having the Mg-containing compound (excluding MgO) which contains Mg dispersed in an Al—Si eutectic composition is formed, and the thickness of this bonding layer is within a range from not less than 5 μm to not more than 80 μm, the heat sink and the power module substrate can be bonded together strongly. In other words, the Mg-containing compound dispersed in the Al—Si eutectic composition is produced by a reaction of the aluminum oxides and Mg, and because this causes the removal of the oxide films of aluminum formed on the bonding surface of the heat sink and the bonding surface of the power module substrate, the heat sink and the power module substrate can be bonded together strongly.

If the thickness of the bonding layer having the Mg-containing compound (excluding MgO) which contains Mg dispersed in the Al—Si eutectic composition is less than 5 μm, then there is a possibility that the removal of the aluminum oxide films formed on the bonding surface of the heat sink and the bonding surface of the power module substrate may be inadequate, making it impossible to strongly bond the heat sink and the power module substrate. On the other hand, if the thickness of the bonding layer is greater than 80 µm, then there is a possibility that cracking or the like may occur within the bonding layer.

As a result, the thickness of the bonding layer having the Mg-containing compound (excluding MgO) which contains Mg dispersed in an Al—Si eutectic composition is prescribed as being within a range from not less than 5 µm to not more than 80 µm.

Here, at least one of the bonding surface of the heat sink and the bonding surface of the power module substrate may be composed of a Mg-containing aluminum alloy which contains Mg, and a Mg reduced region having a reduced abundance ratio of Mg-containing compounds may be formed in the interface vicinity of this bonding surface composed of the Mg-containing aluminum alloy.

In this case, a portion of the Mg contained within at least one of the bonding surface of the heat sink and the bonding surface of the power module substrate acts at the bonding interface by reacting with the aluminum oxide films formed on the bonding surface of the heat sink and the bonding surface of the power module substrate, thus producing Mg-containing compounds and forming the bonding layer having a Mg-containing compound (excluding MgO) which contains Mg dispersed in an Al—Si eutectic composition. Further, because the Mg reduced region having a reduced abundance ratio of Mg-containing compounds is formed in the interface vicinity of the bonding surface composed of the Mg-containing aluminum alloy, the Mg reduced region has a lower deformation resistance, and can function as a stress alleviation layer.

Furthermore, the MgO content in the bonding layer is preferably not more than 20% by area.

MgO can act as a cracking origin during cooling-heating cycle loading, and is therefore undesirable. Further, MgO itself grows significantly, and can inhibit brazing. As a result, the MgO content in the bonding layer is preferably suppressed to not more than 20% by area.

Moreover, the Mg-containing compound dispersed in the bonding layer preferably includes a MgSi-based compound or a MgAlO-based compound.

MgSi-based compounds and MgAlO-based compounds are produced by the reaction of Mg with aluminum oxides, and because they disperse as very fine particles, the aluminum oxide films formed on the bonding surface of the heat sink and the bonding surface of the power module substrate can be reliably removed, enabling the heat sink and the power module substrate to be bonded together strongly, and enabling the provision of a power module substrate with a heat sink having excellent bonding reliability.

A method for producing the power module substrate with a heat sink according to the present invention is a method for producing a power module substrate with a heat sink including a power module substrate having a circuit layer disposed on one surface of an insulating layer, and a heat sink bonded to an other surface of the power module substrate, wherein a bonding surface of the heat sink and a bonding surface of the power module substrate are each composed of aluminum or an aluminum alloy, and the method includes disposing an Al—Si-based brazing material and Mg at the bonding interface between the heat sink and the power module substrate, laminating the heat sink and the power module substrate together, and performing brazing at normal pressure in a non-oxidizing atmosphere with pressure applied in the lamination direction, thereby forming a bonding layer, having a Mg-containing compound (excluding MgO) which contains Mg dispersed in an Al—Si eutectic composition, at a bonding interface between the heat sink and the power module substrate, the bonding layer having a thickness within a range from not less than 5 µm to not more than 80 µm.

According to this method for producing a power module substrate with a heat sink, because the Al—Si-based brazing material and Mg are disposed at the bonding interface between the heat sink and the power module substrate, even though the brazing is performed under normal pressure conditions without using a flux, the oxide films formed on the bonding surface of the heat sink and the bonding surface of the power module substrate can be removed, and the heat sink and the power module substrate can be bonded together reliably.

Further, because the heat sink and the power module substrate are laminated together, and the brazing is performed with pressure applied in the lamination direction, the heat sink and the power module substrate make surface contact, and therefore the Mg that exists at the bonding interface can be prevented from volatilizing and escaping into the atmosphere, and a bonding layer having a Mg-containing compound (excluding MgO) which contains Mg dispersed in an Al—Si eutectic composition can be formed. There is a possibility that Mg which has volatilized into the atmosphere may react with oxygen to form MgO, which can inhibit the bonding process, and therefore it is necessary to suppress Mg volatilization.

Effects of the Invention

The present invention can provide a power module substrate with a heat sink prepared by strong brazing under normal pressure conditions without using a flux, and can also provide a method for producing the power module substrate with a heat sink

BEST MODE FOR CARRYING-OUT THE INVENTION

Power module substrates with heat sinks according to embodiments of the present invention are described below with reference to the appended drawings.

Figure 1:
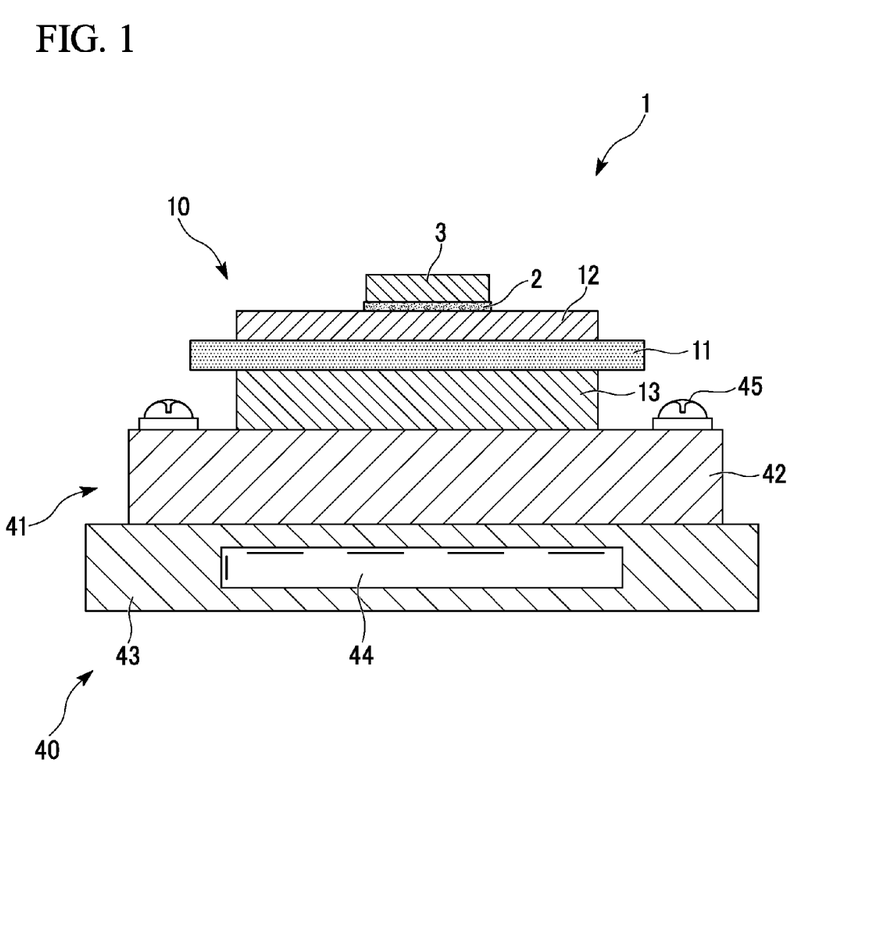
FIG. 1 is a schematic explanatory diagram illustrating a power module substrate with a heat sink according to a first embodiment of the present invention.

FIG. 1 illustrates a power module which uses a power module substrate with a heat sink according to a first embodiment of the present invention.

This power module 1 includes a power module substrate with a heat sink 40, and a semiconductor element (electronic component) 3 which is bonded to one surface (the upper surface in FIG. 1) of this power module substrate with a heat sink 40 via a solder layer 2.

The solder layer 2 is composed of a Sn—Ag-based, Sn—In-based, or Sn—Ag—Cu-based solder material.

The power module substrate with a heat sink 40 includes a power module substrate 10 and a heat sink 41 which cools the power module substrate 10.

The power module substrate 10 includes an insulating substrate 11, a circuit layer 12 disposed on one surface (the upper surface in FIG. 1) of this insulating substrate 11, and a metal layer 13 disposed on the other surface (the lower surface in FIG. 1) of the insulating substrate 11.

The insulating substrate 11 prevents electrical connection between the circuit layer 12 and the metal layer 13, and is formed, for example, from a ceramic having superior insulating properties such as AlN (aluminum nitride), $Si_3N_4$ (silicon nitride) or $Al_2O_3$ (alumina). In the present embodiment, the insulating substrate 11 is composed of $Al_2O_3$ (alumina). Further, the thickness of the insulating substrate 11 is set within a range from 0.2 mm to 1.5 mm, and in the present embodiment is set to 0.635 mm.

The circuit layer 12 is formed by bonding a copper sheet composed of copper or a copper alloy to one surface of the insulating substrate 11. In this embodiment, a rolled sheet of tough pitch copper is used as the copper sheet that constitutes the circuit layer 12. A circuit pattern is formed in the circuit layer 12, and one surface (the upper surface in FIG. 1) of the circuit layer 12 functions as an installation surface onto which the semiconductor element 3 is installed.

The metal layer 13 is formed by bonding an aluminum sheet composed of aluminum or an aluminum alloy to the other surface of the insulating substrate 11. In this embodiment, a rolled sheet of aluminum with a purity of at least 99.99% (so-called 4N aluminum) is used as the aluminum sheet that constitutes the metal layer 13.

The heat sink 41 in this embodiment includes a top plate section 42 which is bonded to the power module substrate 10, and a cooling member 43 which is laminated on the top plate section 42. A channel 44 through which a cooling medium is circulated is formed inside the cooling member 43.

The top plate section 42 and the cooling member 43 are linked together by fixing screws 45. As a result, the top plate section 42 requires sufficient rigidity that it does not easily deform upon screwing in the fixing screws 45. Accordingly, in this embodiment, the top plate section 42 of the heat sink 41 is formed from a metal material having a 0.2% proof stress of at least 100 $N/mm^2$, and the thickness of the top plate section 42 is at least 2 mm.

Specifically, the top plate section 42 that is bonded to the power module substrate 10 is composed of a Mg-containing aluminum alloy which contains Mg, and in the present embodiment, the top plate section 42 is composed of A6063 alloy (an aluminum alloy containing at least 0.45% by mass but not more than 0.9% by mass of Mg). In the Mg-containing aluminum alloy which contains Mg, the Mg content is preferably at least 0.2% by mass but not more than 2.5% by mass, and more preferably at least 0.5% by mass but not more than 1.5% by mass.

Figure 2:
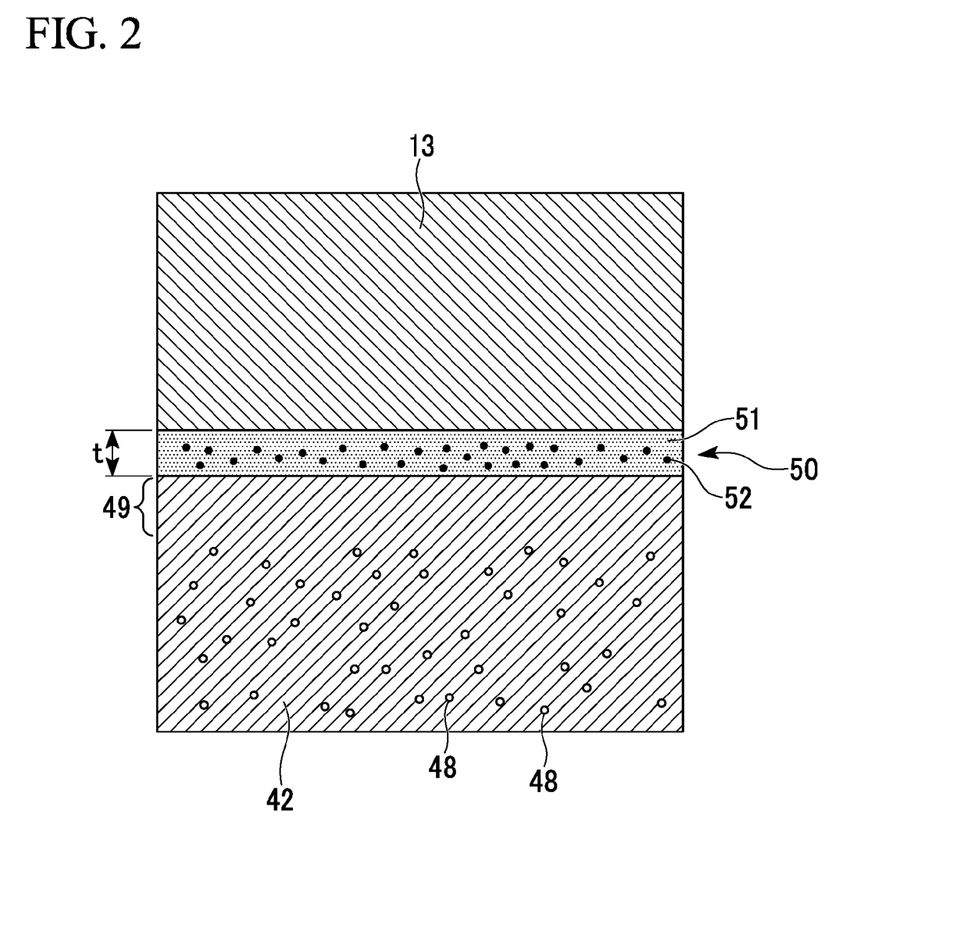
FIG. 2 is an enlarged explanatory diagram of the bonding portion between the metal layer and the heat sink in FIG. 1.

As illustrated in FIG. 2, a bonding layer 50 is formed between the metal layer 13 formed from 4N aluminum and the top plate section 42 formed from A6063 alloy. This bonding layer 50 has a structure in which a Mg-containing compound 52 which contains Mg is dispersed inside a matrix phase 51 composed of an Al—Si eutectic composition. The thickness t of the bonding layer 50 is within a range of 5 µm≤t≤80 µm.

The thickness t of the bonding layer 50 is calculated by observing a cross-section of the layer, positioning the bonding layer 50 so that it is horizontal, measuring the surface area A of the bonding layer 50, and dividing this surface area A by the horizontal direction length L of the bonding layer 50.

In this bonding layer 50, the MgO content is not more than 20% by area, and in the present embodiment, is 10% by area or less.

The Mg-containing compound 52 dispersed in the bonding layer 50 contains a MgSi-based compound or a MgAlO-based compound. Specific examples of MgSi-based compounds include $Mg_2Si$ and the like, whereas specific examples of MgAlO-based compounds include $MgAl_2O_4$ and the like.

Because the top plate section 42 is composed of A6063 alloy containing Mg, Mg-containing compounds 48 which contain Mg are dispersed in the top plate section 42. A Mg reduced region 49 in which the abundance ratio of these Mg-containing compounds 48 is reduced is formed in the portion of the vicinity of the bonding layer 50 in the top plate section 42. The Mg concentration of this Mg reduced region 49 is preferably from 0 to 0.5% by mass, and more preferably from 0.1 to 0.3% by mass.

Figure 3:
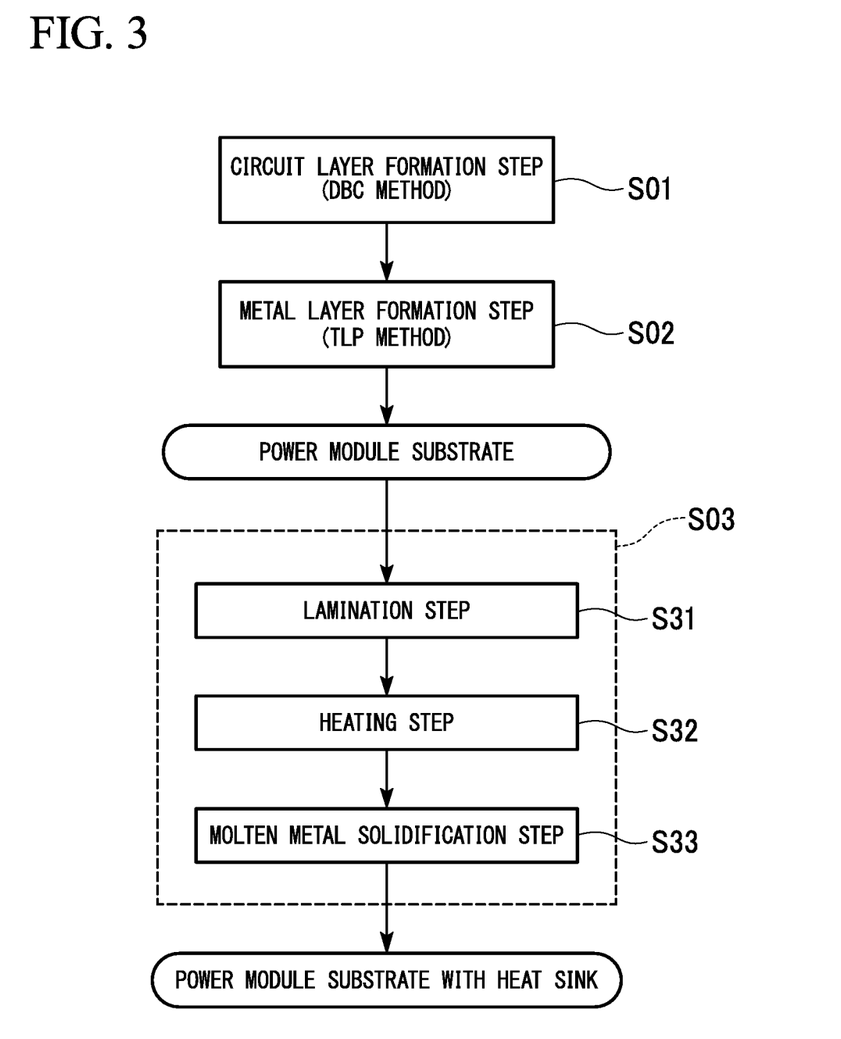
FIG. 3 is a flow chart illustrating a method for producing the power module substrate with a heat sink of FIG. 1.

Next, a method for producing this power module substrate with a heat sink 40 is described with reference to the flow chart of FIG. 3.

First, the copper sheet that becomes the circuit layer 12 is bonded to the insulating substrate 11 (circuit layer formation step S01). Because the insulating substrate 11 is composed of $Al_2O_3$, the bonding of the copper sheet and the insulating substrate 11 is performed using a DBC method which utilizes a eutectic reaction between copper and oxygen. Specifically, the copper sheet formed from tough pitch copper and the insulating substrate 11 are brought into mutual contact, and by performing heating at 1,075° C. for 10 minutes in a nitrogen gas atmosphere, the copper sheet and the insulating substrate 11 are bonded together.

Next, the aluminum sheet that becomes the metal layer 13 is bonded to the other surface of the insulating substrate 11 (metal layer formation step S02).

Sputtering is used to adhere an additional element (one or more of Si, Cu, Zn, Mg, Ge, Ca and Li) to the bonding interface of the aluminum sheet with the insulating substrate 11, thereby forming an anchoring layer. The amount of the additional element in the anchoring layer is within a range from 0.01 $mg/cm^2$ to 10 $mg/cm^2$, and in the present embodiment, Cu is used as the additional element, and the amount of Cu in the anchoring layer is set to at least 0.08 $mg/cm^2$ but not more than 2.7 $mg/cm^2$.

With this aluminum sheet laminated to the other surface of the insulating substrate 11 and a pressure applied in the lamination direction (pressure: 1 to 35 $kgf/cm^2$) heating is performed in a vacuum heating furnace. In this embodiment, the pressure inside the vacuum heating furnace is set within a range from $10^{-3}$ to $10^{-6}$ Pa, and the heating temperature is set within a range from at least 550° C. to not more than 650° C. By so doing, the additional element (Cu) of the anchoring layer diffuses into the aluminum sheet, thereby increasing the concentration of the additional element (Cu concentration) in the aluminum sheet in the vicinity of the anchoring layers and lowering the melting point, thus forming a molten metal region at the interface between the aluminum sheet and the insulating substrate 11.

Next, the temperature is held at a constant value in this state where the molten metal region has been formed. By so doing, the Cu within the molten metal region diffuses further into the aluminum sheet. As a result, the Cu concentration in the portion that was the molten metal region gradually decreases and the melting point increases, so that solidification proceeds with the temperature held at a constant value. As a result of this process, the insulating substrate 11 and the aluminum sheet are bonded together. In other words, the insulating substrate 11 and the aluminum sheet (the metal layer 13) are bonded by so-called transient liquid phase diffusion bonding. After solidification has occurred, the structure is cooled to normal temperature.

In this manner, the power module substrate 10 is produced.

Next, the metal layer 13 of the power module substrate 10 and the top plate section 42 of the heat sink 41 are bonded together (heat sink bonding step S03).

First, an Al—Si-based brazing material is interposed between the metal layer 13 of the power module substrate 10 and the top plate section 42, and the power module substrate 10 and the top plate section 42 are laminated together (lamination step S31). In the present embodiment, an Al—Si-based brazing material foil having a Si content of at least 5.5% by mass but not more than 11.0% by mass and an Al content of at least 89.0% by mass but not more than 94.5% by mass (and containing no Mg), and having a thickness of at least 5 μm but not more than 100 μm is used.

With a pressure (of 0.001 MPa to 0.5 MPa) applied in the lamination direction to the power module substrate 10 and the top plate section 42, heating is performed in an atmospheric furnace having a non-oxidizing atmosphere (heating step S32). In the present embodiment, the atmosphere inside the atmospheric furnace is a nitrogen gas atmosphere, in which the oxygen partial pressure is not more than 120 ppm and the pressure inside the furnace is normal pressure. Further, the heating temperature is at least 590° C. but not more than 630° C. As a result of the heating, the brazing foil material, a portion of the metal layer 13 and a portion of the top plate section 42 melt at the bonding interface between the metal layer 13 and the top plate section 42, thereby forming a molten metal region.

At this time, the Mg within the Mg-containing compound 48 dispersed in the vicinity of the bonding interface of the top plate section 42 acts upon the bonding interface, and the aluminum oxide films formed on the bonding surface of the top plate section 42 and the bonding surface of the metal layer 13 are removed through reaction with the Mg.

Then, by lowering the temperature inside the atmospheric furnace, the molten metal region formed at the bonding interface between the metal layer 13 and the top plate section 42 is solidified, thereby bonding the metal layer 13 and the top plate section 42 together (molten metal solidification step S33). At this time, the bonding layer 50 having an Al—Si eutectic composition as the matrix phase 51 is formed at the bonding interface between the metal layer 13 and the top plate section 42. Further, the Mg-containing compound (MgAlO-based compound in the present embodiment) produced as a result of the reaction between the aluminum oxide films and Mg is dispersed within this bonding layer 50.

Moreover, the Mg-containing compound 48 dispersed near the vicinity of the bonding interface of the top plate section 42 acts upon the bonding interface, resulting in the formation of a Mg reduced region 49 having a lower abundance ratio of the Mg-containing compound in the vicinity of the bonding interface of the top plate section 42.

In this manner, the power module substrate with a heat sink 40 according to the present embodiment is produced.

According to the power module substrate with a heat sink 40 of the present embodiment, because the bonding layer 50 having a structure composed of an Al—Si eutectic composition as the matrix phase 51 and the Mg-containing compound 52 dispersed within this matrix phase 51 is formed at the bonding interface between the metal layer 13 formed from 4N aluminum and the top plate section 42 formed from A6063 alloy, and the thickness of this bonding layer 50 is within a range from at least 5 μm to not more than 80 μm, the aluminum oxide films formed on the bonding surface of the metal layer 13 and the bonding surface of the top plate section 42 can be removed, and the metal layer 13 and the top plate section 42 can be bonded together strongly. Accordingly, a power module substrate with a heat sink 40 having excellent bonding reliability between the power module substrate 10 and the heat sink 41 can be produced.

Further, because the MgO content in the bonding layer 50 is not more than 20% by area, cracking in the bonding layer 50 during cooling-heating cycle loading is suppressed, and brazing can be performed favorably, meaning the bonding reliability between the power module substrate 10 and the heat sink 41 is improved dramatically. In particular, in the present embodiment, because the MgO content of the bonding layer 50 is 10% by area or less, the bonding reliability between the power module substrate 10 and the heat sink 41 can be improved with good certainty.

Moreover, because the Mg-containing compound 52 dispersed in the matrix phase 51 of the bonding layer 50 is a MgSi-based compound or an MgAlO-based compound, the compound is dispersed as fine particles within the bonding layer 50, thus enabling the power module substrate 10 and the heat sink 41 to be bonded reliably and with good strength.

Further, because the top plate section 42 is composed of A6063 alloy containing Mg, and the Mg reduced region 49 having a reduced abundance ratio of the Mg-containing compound 48 is formed in the portion of the vicinity of the bonding layer 50 in the top plate section 42, this Mg reduced region 49 has low deformation resistance and can function as a stress alleviation layer. Accordingly, thermal stress caused by a difference in the coefficients of thermal expansion of the heat sink 41 and the insulating substrate 11 can be moderated by deformation of this Mg reduced region 49, enabling cracking of the insulating substrate 11 to be prevented.

Furthermore, in the method for producing the power module substrate with a heat sink 40 according to the present embodiment, because the power module substrate 10 and the heat sink 41 are bonded in a nitrogen gas atmosphere with an oxygen partial pressure of not more than 120 ppm under normal pressure conditions, a power module substrate with a heat sink 40 having excellent bonding reliability can be produced with good efficiency and at low cost.

Moreover, because a flux is not used, when the power module substrate 10 and the heat sink 41 are bonded together, there is little effect on the bonding interface between the circuit layer 12 and the insulating substrate 11, and the bonding interface between the insulating substrate 11 and the metal layer 13, meaning any deterioration of the bonding reliability between the circuit layer 12 and the insulating substrate 11, and between the insulating substrate 11 and the metal layer 13, can be prevented.

Moreover, because the power module substrate 10 and the top plate section 42 are subjected to brazing with pressure (0.001 MPa to 0.5 MPa) applied in the lamination direction, by heating in an atmospheric furnace having a non-oxidizing atmosphere, the power module substrate 10 and the top plate section 42 make surface contact, meaning Mg that exists at the bonding interface can be prevented from volatilizing and escaping into the atmosphere, enabling the bonding layer 50 having a Mg-containing compound (excluding MgO) which contains Mg dispersed in an Al—Si eutectic composition to be formed.

Figure 4:
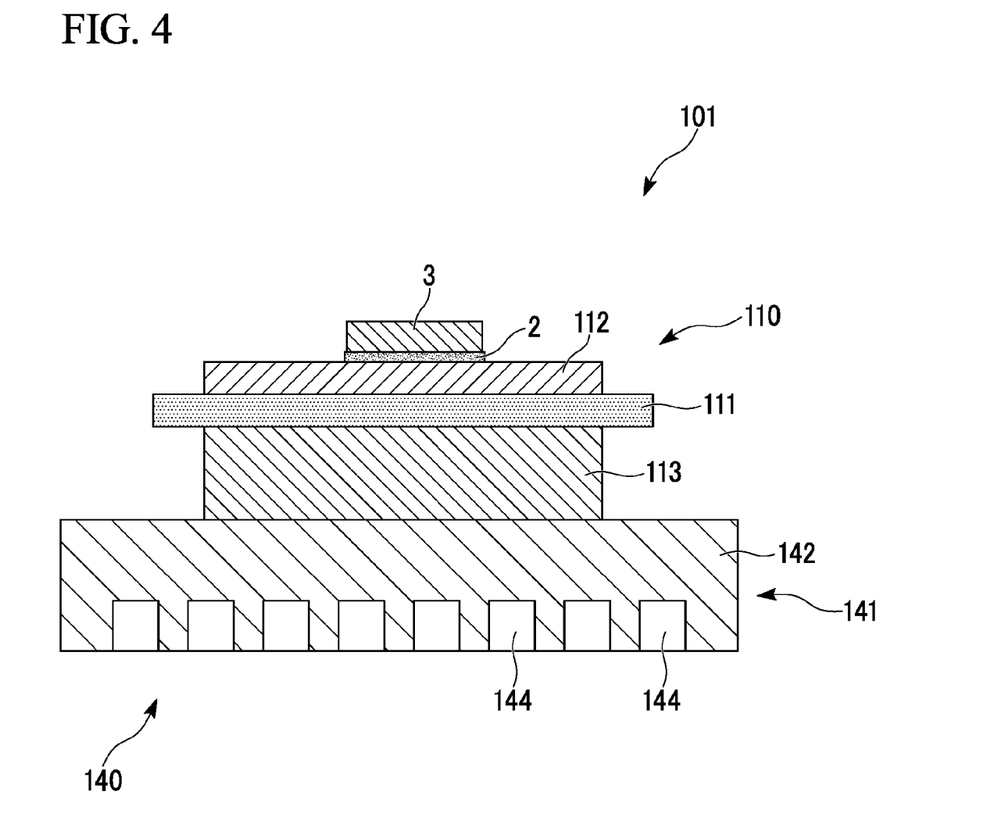
FIG. 4 is a schematic explanatory diagram illustrating a power module substrate with a heat sink according to a second embodiment of the present invention.

A power module substrate with a heat sink according to a second embodiment of the present invention is described below. FIG. 4 illustrates a power module which uses the power module substrate with a heat sink according to the second embodiment of the present invention.

This power module 101 includes a power module substrate with a heat sink 140, and a semiconductor element (electronic component) 3 which is bonded to one surface (the upper surface in FIG. 4) of this power module substrate with a heat sink 140 via a solder layer 2.

The solder layer 2 is composed of a Sn—Ag-based, Sn—In-based, or Sn—Ag—Cu-based solder material.

The power module substrate with a heat sink 140 includes a power module substrate 110 and a heat sink 141 which cools the power module substrate 110.

The power module substrate 110 includes an insulating substrate 111, a circuit layer 112 disposed on one surface (the upper surface in FIG. 4) of this insulating substrate 111, and a metal layer 113 disposed on the other surface (the lower surface in FIG. 4) of the insulating substrate 111.

The insulating substrate 111 prevents electrical connection between the circuit layer 112 and the metal layer 113, and is formed, for example, from a ceramic having superior insulating properties such as AlN (aluminum nitride), $Si_3N_4$ (silicon nitride) or $Al_2O_3$ (alumina). In the present embodiment, the insulating substrate 111 is composed of AlN (aluminum nitride). Further, the thickness of the insulating substrate 111 is set within a range from 0.2 mm to 1.5 mm, and in the present embodiment is set to 0.635 mm.

The circuit layer 112 is formed by bonding an aluminum sheet composed of aluminum or an aluminum alloy to one surface of the insulating substrate 111. In this embodiment, a rolled sheet of aluminum with a purity of at least 99.99% (so-called 4N aluminum) is used as the aluminum sheet that constitutes the circuit layer 112. A circuit pattern is formed in the circuit layer 112, and one surface (the upper surface in FIG. 4) of the circuit layer 112 functions as an installation surface onto which the semiconductor element 3 is installed.

The metal layer 113 is formed by bonding an aluminum sheet composed of aluminum or an aluminum alloy to the other surface of the insulating substrate 111. In this embodiment, a rolled sheet of aluminum with a purity of at least 99.99% (so-called 4N aluminum) is used as the aluminum sheet that constitutes the metal layer 113.

The heat sink 141 in this embodiment includes a top plate section 142 which is bonded to the power module substrate 110, and a channel 144 through which a cooling medium (such as cold water) is circulated.

The heat sink 141 (the top plate section 142) is preferably composed of a material having favorable thermal conductivity, and must also have sufficient rigidity to function as a structural material. In the present embodiment, the top plate section 142 of the heat sink 141 is formed from A3003 (an aluminum alloy).

Figure 5:
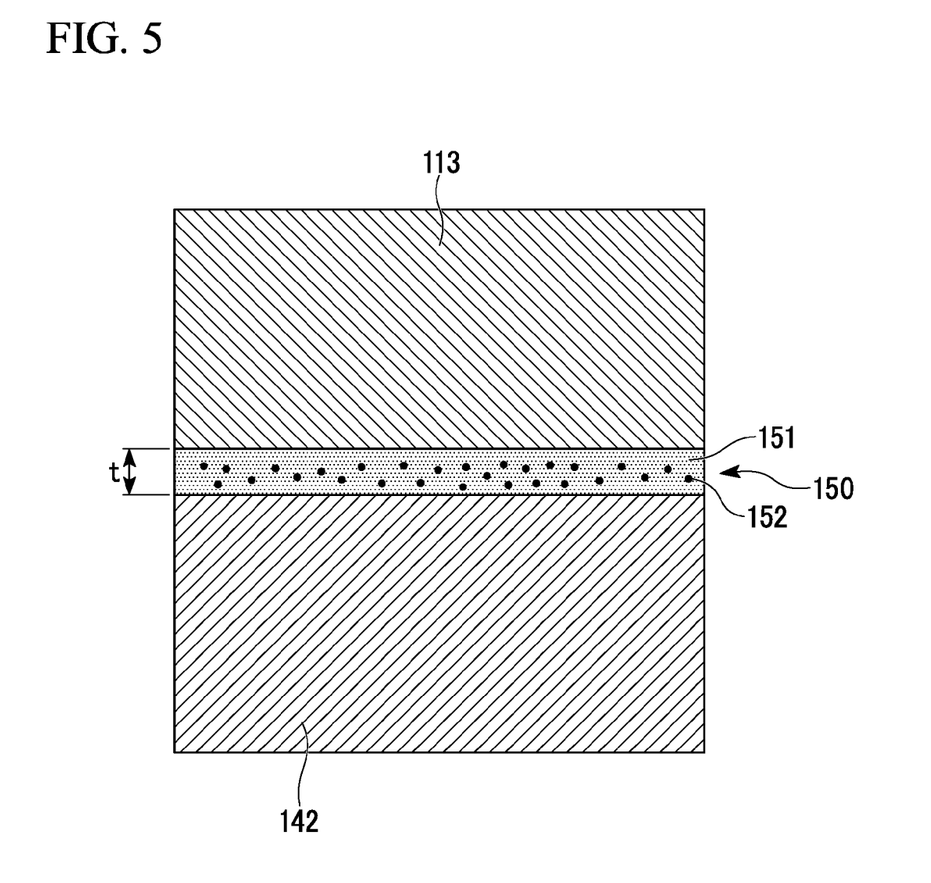
FIG. 5 is an enlarged explanatory diagram of the bonding portion between the metal layer and the heat sink in FIG. 4.

As illustrated in FIG. 5, a bonding layer 150 is formed between the metal layer 113 formed from 4N aluminum and the top plate section 142 formed from A3003 alloy. This bonding layer 150 has a structure in which a Mg-containing compound 152 which contains Mg is dispersed inside a matrix phase 151 composed of an Al—Si eutectic composition. The thickness t of the bonding layer 150 is within a range of 5 μm≤t≤80 μm.

The thickness t of the bonding layer 150 is calculated by observing a cross-section of the layer, positioning the bonding layer 150 so that it is horizontal, measuring the surface area A of the bonding layer 150, and dividing this surface area A by the horizontal direction length L of the bonding layer 150.

In this bonding layer 150, the MgO content is not more than 20% by area, and in the present embodiment, is 10% by area or less.

Further, the Mg-containing compound 152 dispersed in the bonding layer 150 contains a MgSi-based compound or a MgAlO-based compound. Specific examples of MgSi-based compounds include $Mg_2Si$ and the like, whereas specific examples of MgAlO-based compounds include $MgAl_2O_4$ and the like.

Figure 6:
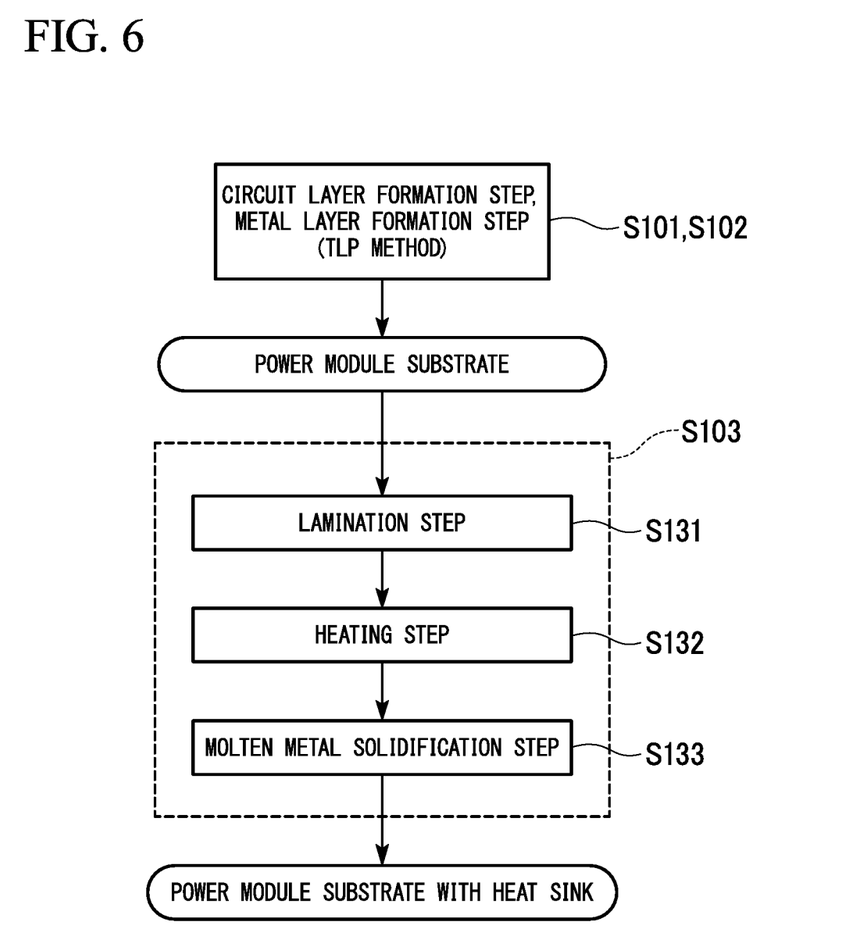
FIG. 6 is a flow chart illustrating a method for producing the power module substrate with a heat sink of FIG. 4.

Next, a method for producing this power module substrate with a heat sink 140 is described with reference to the flow chart of FIG. 6.

First, the aluminum sheet that becomes the circuit layer 112 is bonded to the insulating substrate 111 (circuit layer formation step S101). Further, the aluminum sheet that becomes the metal layer 113 is also bonded to the insulating substrate 111 (metal layer formation step S102). In the present embodiment, the circuit layer formation step S101 and the metal layer formation step S102 are performed simultaneously.

Anchoring layers are formed by using screen printing to apply a paste containing an additional element (one or more of Si, Cu, Zn, Mg, Ge, Ca and Li) to one surface and the other surface of the insulating substrate 111, and subsequently drying the paste.

In the present embodiment, Ag is used as the additional element. The Ag paste used contains a silver powder, a resin, a solvent and a dispersant, wherein the silver powder content is at least 60% by mass but not more than 90% by mass of the entire Ag paste, with the remainder composed of the resin, the solvent and the dispersant. In this embodiment, the Ag paste content is 85% by mass of the entire Ag paste.

Next, the aluminum sheet that becomes the circuit layer 112, the insulating substrate 111, and the aluminum sheet that becomes the metal layer 113 are laminated together, and heated in a vacuum heating furnace with pressure applied in the lamination direction (pressure: 1 to 35 kgf/cm$^2$). In this embodiment, the pressure inside the vacuum heating furnace is set within a range from $10^{-3}$ to $10^{-6}$ Pa, and the heating temperature is set within a range from at least 550° C. to not more than 650° C. By so doing, the additional element (Ag) of the anchoring layers diffuses into the aluminum sheets, thereby increasing the concentration of the additional element (Ag concentration) in the aluminum sheet in the vicinity of the anchoring layers and lowering the melting point, thus forming a molten metal region at each of the interfaces between the aluminum sheets and the insulating substrate 111.

Next, the temperature is held at a constant value in this state where the molten metal regions have been formed. By so doing, the Ag within the molten metal regions diffuses further into the aluminum sheets. As a result, the Ag concentration in the portions that were the molten metal regions gradually decreases and the melting point increases, so that solidification proceeds with the temperature held at a constant value. As a result of this process, the insulating substrate 111 and the aluminum sheets are bonded together. In other words, the circuit layer 112 and the insulating substrate 111, and the insulating substrate 111 and the metal layer 113 are bonded by so-called transient liquid phase diffusion bonding. After solidification has occurred, the structure is cooled to normal temperature.

In this manner, the power module substrate 110 is produced.

Next, the metal layer 113 of the power module substrate 110 and the heat sink 141 are bonded together (heat sink bonding step S103).

First, an Al—Si-based brazing material is interposed between the metal layer 113 of the power module substrate 110 and the heat sink 141, and the power module substrate 110 and the heat sink 141 are laminated together (lamination step S131). In the present embodiment, an Al—Si-based brazing material foil having a Si content of at least 5.5% by mass but not more than 11.0% by mass and an Al content of at least 86.5% by mass but not more than 94.4% by mass, and having a thickness of at least 5 μm but not more than 100 μm is used. This brazing material foil also contains Mg in an amount of at least 0.1% by mass but not more than 2.5% by mass.

With a pressure (of 0.001 MPa to 0.5 MPa) applied in the lamination direction to the power module substrate 110 and the heat sink 141, heating is performed in an atmospheric furnace having a non-oxidizing atmosphere (heating step S132). In the present embodiment, the atmosphere inside the atmospheric furnace is a nitrogen gas atmosphere, in which the oxygen partial pressure is not more than 120 ppm. Further, the pressure inside the furnace is normal pressure. Furthermore, the heating temperature is at least 590° C. but not more than 630° C. As a result of the heating, the brazing foil material, a portion of the metal layer 113 and a portion of the heat sink 141 melt at the bonding interface between the metal layer 113 and the heat sink 141, thereby forming a molten metal region.

At this time, the aluminum oxide films formed on the bonding surface of the heat sink 141 and the bonding surface of the metal layer 113 are removed by reaction with the Mg contained in the brazing material foil.

Then, by lowering the temperature inside the atmospheric furnace, the molten metal region formed at the bonding interface between the metal layer 113 and the heat sink 141 is solidified, thereby bonding the metal layer 113 and the heat sink 141 together (solidification step S133). At this time, the bonding layer 150 having an Al—Si eutectic composition as the matrix phase 151 is formed at the bonding interface between the metal layer 113 and the heat sink 141. Further, the Mg-containing compound 152 (MgAlO-based compound in the present embodiment) produced as a result of the reaction between the aluminum oxide films and Mg is dispersed within this bonding layer 150.

In this manner, the power module substrate with a heat sink 140 according to the present embodiment is produced.

According to the power module substrate with a heat sink 140 of the present embodiment, which utilizes a bonding structure between aluminum members, because the bonding layer 150 having a structure composed of an Al—Si eutectic composition as the matrix phase 151 and the Mg-containing compound 152 dispersed within this matrix phase 151 is formed at the bonding interface between the metal layer 113 formed from 4N aluminum and the heat sink 141 formed from A3003 alloy, and the thickness of this bonding layer 150 is within a range from at least 5 μm to not more than 80 μm, the aluminum oxide films formed on the bonding surface of the metal layer 113 and the bonding surface of the heat sink 141 can be removed, and the metal layer 113 and the heat sink 141 can be bonded together strongly. Accordingly, a power module substrate with a heat sink 140 having excellent bonding reliability between the power module substrate 110 and the heat sink 141 can be produced.

Further, because the brazing material foil contains Mg, the metal layer 113 (4N aluminum) and the heat sink 141 (A3003 alloy), each of which is composed of aluminum or an aluminum alloy containing no Mg, can be bonded together via the bonding layer 150 which has a structure composed of an Al—Si eutectic composition as the matrix phase 151 and the Mg-containing compound 152 dispersed within this matrix phase 151.

Moreover, because the power module substrate 110 and the heat sink 141 are subjected to brazing with pressure (0.001 MPa to 0.5 MPa) applied in the lamination direction, by heating in an atmospheric furnace having a non-oxidizing atmosphere with an oxygen partial pressure of not more than 120 ppm, the power module substrate 110 and the heat sink 141 make surface contact, meaning Mg that exists at the bonding interface can be prevented from volatilizing and escaping into the atmosphere, and therefore the bonding layer 150 having a Mg-containing compound (excluding MgO) which contains Mg dispersed in an Al—Si eutectic composition can be formed.

Although embodiments of the present invention have been described above, the present invention is in no way limited by these embodiments, and suitable modifications can be made without departing from the technical scope of the invention.

For example, there are no particular limitations on the structure of the heat sink or the structure of the power module substrate, and heat sinks and power module substrates having other structures may also be used, provided they are structures that involve the bonding together of aluminum members.

Further, the aluminum sheet that constitutes the metal layer was described in the embodiments as being a rolled sheet of pure aluminum having a purity of at least 99.99% by mass, but the present invention is not limited to this configuration, and aluminum having a purity of 99% (2N aluminum) may also be used.

Moreover, structures were described in which ceramic substrates formed from $Al_2O_3$ and AlN were used as the insulating layer, but the present invention is not limited to such structures, and a ceramic substrate formed from $Si_3N_4$ may be used, or the insulating layer may be formed from an insulating resin.

EXAMPLES

The results of tests performed to confirm the effects of the present invention are described below.

As shown in Table 1, an insulating substrate, an aluminum sheet that becomes a circuit layer, and an aluminum sheet that becomes a metal layer were bonded together to prepare a series of power module substrates.

The bonding of the aluminum sheet that becomes the circuit layer and the insulating substrate, and the bonding of the insulating substrate and the aluminum sheet that becomes the metal layer were performed under the following conditions. The aluminum sheet that becomes the circuit layer, the insulating substrate, and the aluminum sheet that becomes the metal layer were laminated together via layers of a brazing material foil composed of Al-10% by mass Si, and the structure was bonded together by heating in a vacuum heating furnace at 650° C. for 30 minutes with a pressure of 5 kgf/cm² applied in the lamination direction.

The A1100 used for the metal layer in Table 1 was an aluminum having an Al purity of at least 99%, and the A1050 was an aluminum having an Al purity of at least 99.50%.

TABLE 1

| | | Circuit layer | | | Ceramic | | | Metal layer | | |
|---|---|---|---|---|---|---|---|---|---|---|
| | | Material | Thickness | Dimensions | Material | Thickness | Dimensions | Material | Thickness | Dimensions |
| Comparative Example | 1 | 4N—Al | 0.6 mm | 37 × 37 mm | $Si_3N_4$ | 0.32 mm | 40 × 40 mm | A1100 | 1.1 mm | 37 × 37 mm |
| | 2 | 4N—Al | 0.6 mm | 37 × 37 mm | AlN | 0.635 mm | 40 × 40 mm | A1050 | 2.1 mm | 37 × 37 mm |
| | 3 | 4N—Al | 0.6 mm | 37 × 37 mm | $Al_2O_3$ | 0.38 mm | 40 × 40 mm | 4N—Al | 2.1 mm | 37 × 37 mm |
| Example | 1 | 4N—Al | 0.6 mm | 37 × 37 mm | AlN | 0.635 mm | 40 × 40 mm | 4N—Al | 1.6 mm | 37 × 37 mm |
| | 2 | 4N—Al | 0.6 mm | 37 × 37 mm | $Al_2O_3$ | 0.32 mm | 40 × 40 mm | A1050 | 2.0 mm | 37 × 37 mm |
| | 3 | 4N—Al | 0.6 mm | 37 × 37 mm | $Si_3N_4$ | 0.32 mm | 40 × 40 mm | A1100 | 1.1 mm | 37 × 37 mm |
| | 4 | 4N—Al | 0.6 mm | 37 × 37 mm | AlN | 0.635 mm | 40 × 40 mm | A1050 | 2.1 mm | 37 × 37 mm |

Then, each power module substrate and a heat sink (top plate section) were bonded together under the conditions shown in Table 2 to prepare a power module substrate with a heat sink. The brazing materials shown in Table 2 were Al—Si-based brazing materials, and the Mg content within each brazing material is shown in Table 2. Further, the Si content of each of the Al—Si-based brazing materials was 10.5% by mass, with the remainder being Al. In Table 2, A3003 is an aluminum alloy containing Mn as an additional element.

TABLE 2

| | | Top plate | | | DBA/Top plate bonding | | | |
|---|---|---|---|---|---|---|---|---|
| | | Material | Thickness | Dimensions | Brazing material | Load | Atmosphere | Flux |
| Comparative Example | 1 | A1050 | 5 mm | 70 × 70 mm | no Mg | 0.005 MPa | $N_2$ ($PO_2$: 30 ppm) | none |
| | 2 | A6063 | 5 mm | 70 × 70 mm | Mg 2.5 | 0.05 MPa | $N_2$ ($PO_2$: 180 ppm) | none |
| | 3 | A6063 | 5 mm | 70 × 70 mm | Mg 2.5 | no load | $N_2$ ($PO_2$: 150 ppm) | none |
| Example | 1 | A6063 | 5 mm | 70 × 70 mm | Mg 0.5 | 0.005 MPa | $N_2$ ($PO_2$: 20 ppm) | none |
| | 2 | A3003 | 5 mm | 70 × 70 mm | Mg 1.0 | 0.002 MPa | $N_2$ ($PO_2$: 120 ppm) | none |
| | 3 | A1050 | 5 mm | 70 × 70 mm | Mg 1.5 | 0.01 MPa | $N_2$ ($PO_2$: 80 ppm) | none |
| | 4 | A6063 | 5 mm | 70 × 70 mm | no Mg | 0.01 MPa | $N_2$ ($PO_2$: 50 ppm) | none |

For each obtained power module substrate with a heat sink, the bonding interface between the metal layer and the heat sink was inspected, and the thickness of the bonding layer, the presence of Mg-containing compounds, and the MgO content were evaluated.

The thickness of the bonding layer was measured in the following manner. The obtained power module substrate with a heat sink was cut with a diamond saw along a diagonal line across the insulating substrate. The cut structure was embedded in a resin, and the cross-sectional surface was subjected to mirror polishing to prepare a cross-section sample. This cross-section sample was observed, and the bonding interface between the metal layer and the heat sink was analyzed from the EPMA backscattered electron image. The observed bonding layer was positioned along the horizontal, a backscattered electron image was acquired, and the surface area A of the bonding layer was measured by binary coded processing. The thickness of the layer was then calculated by dividing this surface area A of the bonding layer by the horizontal direction length L of the observed field of view. These operations were performed for 5 different fields of view, and the average of the 5 values was recorded as the thickness t of the bonding layer.

The Mg-containing compounds were evaluated by acquiring an elemental mapping image by EPMA for the aforementioned cross-section sample, and then determining the regions in which Mg exists, and identifying the other elements that exist within the same regions to enable the composition of the compounds to be ascertained. In Examples 1 to 4, and in Comparative Examples 1 and 2, Mg, Al and O were found to exist in the same locations, confirming the existence of MgAlO-based compounds.

In terms of the MgO content (the MgO surface area fraction), the cross-section sample prepared in the manner described above was positioned so that the observed bonding layer was positioned along the horizontal, a backscattered electron image was then acquired, and the surface area A of the bonding layer was measured by binary coded processing. Next, an elemental mapping image was acquired by EPMA, regions in which only Mg and O coexisted were detected, and the surface area of these regions were measured by image processing to determine the MgO surface area. This MgO surface area was then divided by the surface area A of the bonding layer. These operations were performed for 5 different fields of view, and the average of the 5 values was recorded as the MgO content (MgO surface area fraction).

Further, a cooling-heating cycle test was performed for each obtained power module substrate with a heat sink, and the initial bonding ratio and the bonding ratio after the cooling-heating cycle test were compared. In the cooling-heating cycle test, one repetition of −40° C.×5 minutes and one repetition of 125° C.×3 minutes represented a single cycle, and 3,000 cycles were performed.

The bonding ratio was determined using an ultrasonic flaw detector, using the formula shown below. The initial bonding surface area represents the surface area to be bonded prior to bonding, namely the surface area of the metal layer. In the ultrasonic flaw image, detachment was indicated by white portions within the bonding region, and therefore the surface area of these white portions was recorded as the detached surface area.

(Bonding ratio)={(initial bonding surface area)−(detached surface area)}/(initial bonding surface area)

The evaluation results are shown in Table 3.

TABLE 3

|  |  | Bonding layer | | Bonding ratio | |
|---|---|---|---|---|---|
|  |  | Thickness (μm) | MgO content | Initial | After cooling-heating cycles |
| Comparative Example | 1 | 35 | 0% | 32% | 5% |
|  | 2 | 2 | 25% | 97% | 25% |
|  | 3 | 92 | 30% | 82% | 31% |
| Example | 1 | 40 | 5% | 100% | 92% |
|  | 2 | 78 | 18% | 99% | 91% |
|  | 3 | 14 | 12% | 98% | 90% |
|  | 4 | 6 | 8% | 99% | 86% |

In Comparative Example 1, in which the lack of a Mg source meant that Mg-containing compounds could not be formed, the initial bonding ratio and the bonding ratio after the cooling-heating cycles were both low.

Further, in Comparative Example 2, in which the thickness of the bonding layer was extremely thin at only 2 μm, although Mg-containing compounds existed, the bonding ratio after the cooling-heating cycles was low.

Moreover, in Comparative Example 3, in which the thickness of the bonding layer was very thick at 92 μm, cracking occurred within the bonding layer, and the bonding ratio after the cooling-heating cycles was low.

In contrast, in Examples 1 to 4, the initial bonding ratio and the bonding ratio after the cooling-heating cycles were both high, confirming that the power module substrate and the heat sink were bonded together strongly.

DESCRIPTION OF THE REFERENCE SIGNS

1, 101: Power module
10, 110: Power module substrate
11, 111: Insulating substrate
12, 112: Circuit layer
13, 113: Metal layer
40, 140: Power module substrate with heat sink
41, 141: Heat sink
42, 142: Top plate section
49: Mg reduced region
50, 150: Bonding layer
52, 152: Mg-containing compound

The invention claimed is:

1. A power module substrate with a heat sink, comprising:
a power module substrate having a circuit layer disposed on one surface of an insulating layer, and
a heat sink bonded to an other surface of the power module substrate, wherein
a bonding surface of the heat sink and a bonding surface of the power module substrate are each composed of aluminum or an aluminum alloy,
a metal layer, which is composed of a rolled sheet of aluminum or an aluminum alloy, is formed on an other surface of the insulating layer in the power module substrate, and the heat sink bonded to the metal layer,
a bonding layer having a Mg-containing compound (excluding MgO) which contains Mg dispersed in an Al-Si eutectic composition is formed at a bonding interface between the heat sink and the power module substrate,
a thickness of the bonding layer is within a range from not less than 5 μm to not more than 80 μm, and
a MgO content in the bonding layer is not more than 20% by area.

2. The power module substrate with a heat sink according to claim 1, wherein
at least one of the bonding surface of the heat sink and the bonding surface of the power module substrate is composed of a Mg-containing aluminum alloy which contains Mg, and
a Mg reduced region having a reduced abundance ratio of Mg-containing compounds is formed near a bonding interface of the bonding surface composed of the Mg-containing aluminum alloy.

3. The power module substrate with a heat sink according to claim 1, wherein the Mg-containing compound dispersed in the bonding layer comprises a MgSi-based compound or a MgAlO-based compound.

4. A method for producing a power module substrate with a heat sink comprising a power module substrate having a circuit layer disposed on one surface of an insulating layer, and a heat sink bonded to an other surface of the power module substrate, the method comprising:
a step of disposing an Al-Si-based brazing material and Mg at a bonding interface between the heat sink and the power module substrate, laminating the heat sink and the power module substrate together,
a step of brazing the heat sink and the power module substrate at normal pressure in a nitrogen gas atmosphere with a pressure of at least 0.001 MPa but not more than 0.5 MPa applied in a lamination direction, and
a step of forming a bonding layer, having a Mg-containing compound (excluding MgO) which contains Mg dispersed in an Al-Si eutectic composition, at the bonding interface between the heat sink and the power module substrate, the bonding layer having a thickness within a range from not less than 5 μm to not more than 80 μm, wherein
a bonding surface of the heat sink and a bonding surface of the power module substrate are each composed of aluminum or an aluminum alloy,
a metal layer, which is composed of a rolled sheet of aluminum or an aluminum alloy, is formed on an other surface of the insulating layer in the power module substrate, and the heat sink bonded to the metal layer,
the step of brazing is performed by not using a flux, and
a MgO content in the bonding layer is not more than 20% by area.

* * * * *